United States Patent [19]
Ward

[11] Patent Number: 5,686,827
[45] Date of Patent: Nov. 11, 1997

[54] TEMPERATURE COMPENSATED HALL EFFECT DEVICE

[75] Inventor: Charles E. Ward, Sarasota, Fla.

[73] Assignee: Eaton Corporation, Cleveland, Ohio

[21] Appl. No.: 599,136

[22] Filed: Feb. 9, 1996

[51] Int. Cl.[6] .................................................. H03K 17/00
[52] U.S. Cl. ............................................................ 323/368
[58] Field of Search .............................. 330/6; 323/268, 323/294; 327/510

[56] References Cited

U.S. PATENT DOCUMENTS

| | | | |
|---|---|---|---|
| 3,816,766 | 6/1974 | Anselmo et al. | 307/278 |
| 4,134,030 | 1/1979 | Pace | 307/309 |
| 4,371,837 | 2/1983 | Sieverin | 324/225 |
| 4,435,653 | 3/1984 | Matui et al. | 307/309 |
| 4,593,241 | 6/1986 | Eulenberg et al. | 323/294 |
| 4,646,014 | 2/1987 | Eulenberg | 324/251 |
| 5,550,469 | 8/1996 | Tanabe et al. | 324/251 |

FOREIGN PATENT DOCUMENTS

| | | |
|---|---|---|
| 0129817 | 6/1984 | European Pat. Off. . |
| 904521 | 8/1962 | United Kingdom . |

*Primary Examiner*—Aditya Krishnan
*Attorney, Agent, or Firm*—Tarolli, Sundheim, Covell, Tummino & Szabo

[57] ABSTRACT

An apparatus includes a Hall effect device which generates an electrical output signal upon exposure to a magnetic field. An operating current for the Hall effect device is varied by input circuitry to maintain the output signal from the Hall effect device constant with variations in temperature of the Hall effect device while the magnetic field to which the Hall effect device is exposed remains constant. The input circuitry includes a temperature responsive element which is maintained at a temperature which varies as a function of variations in the temperature of the Hall effect device. The temperature responsive element is a silicon diode.

10 Claims, 1 Drawing Sheet

TEMPERATURE COMPENSATED HALL EFFECT DEVICE

BACKGROUND OF THE INVENTION

The present invention relates to a Hall effect device which generates an electrical potential upon exposure to a magnetic field.

Hall effect devices have been used to provide an output which varies as a function of strength of a magnetic field to which the Hall effect device is exposed. However, the output signal from the Hall effect device varies as a function of both variations in the magnetic field to which the Hall effect device is exposed and variations in the temperature of the Hall effect device. Thus, if the magnetic field to which the Hall effect device is exposed is maintained constant and the temperature of the Hall effect device is increased, the electrical potential generated by the Hall effect device will decrease. In order to compensate for variations in the electrical potential generated by the Hall effect device with variations in temperature, it has been suggested that the Hall effect device be associated with electrical circuitry constructed in the manner disclosed in U.S. Pat. Nos. 4,646,014, or 4,435,653, or 4,134,030.

SUMMARY OF THE INVENTION

The present invention provides a new and improved apparatus which includes a Hall effect device which generates an electrical potential upon exposure to a magnetic field. Input circuitry provides an operating current for the Hall effect device. In order to maintain the electrical potential generated by the Hall effect device constant with variations in temperature while the magnetic field to which the Hall effect device is exposed remains constant, the input circuitry includes a temperature responsive element which varies an electrical characteristic of the input circuitry in response to a variation in temperature of the temperature responsive element.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DESCRIPTION OF ONE SPECIFIC PREFERRED EMBODIMENT OF THE INVENTION

Figure 1:
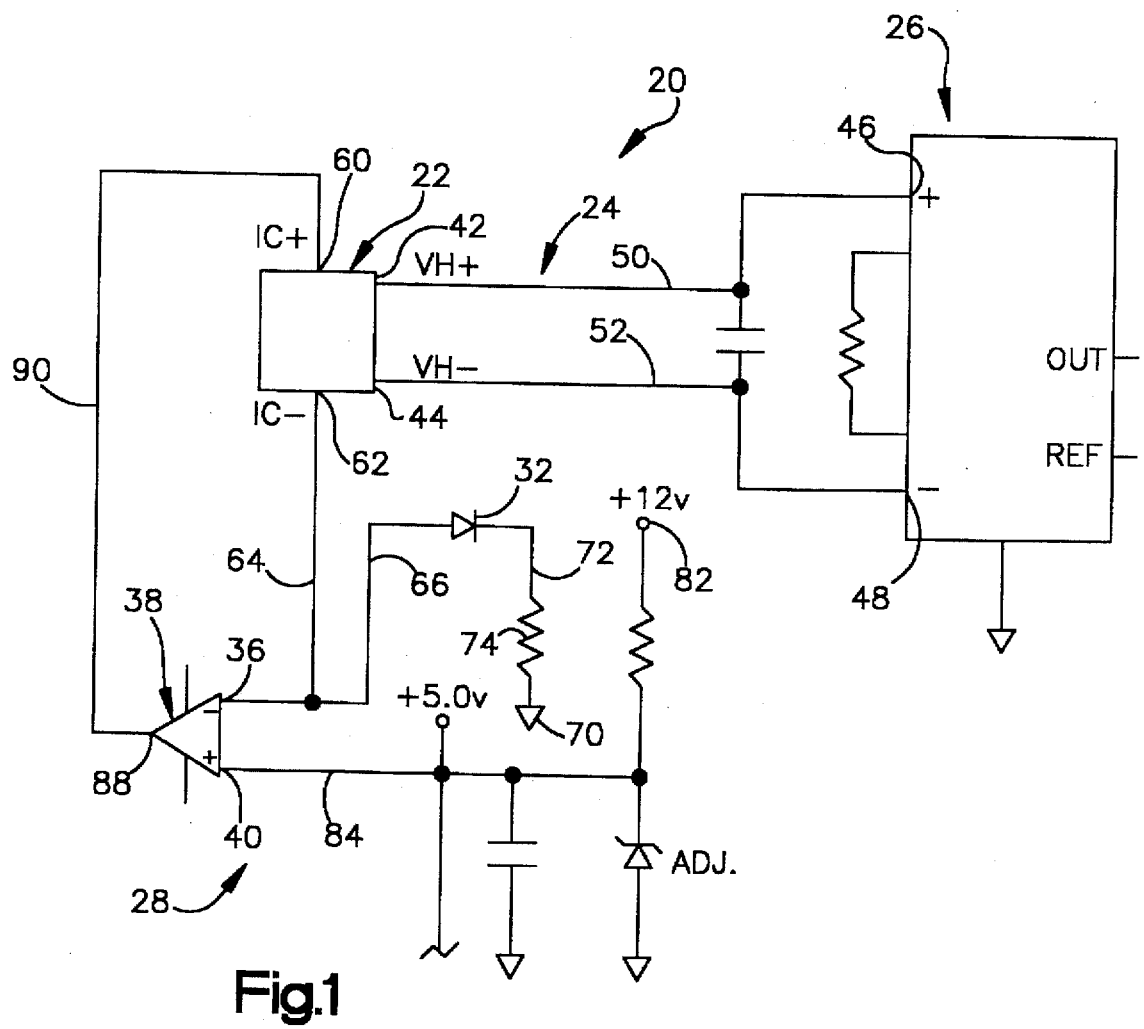
FIG. 1 is a schematic illustration of apparatus which includes a Hall effect device and temperature compensating circuitry constructed in accordance with the present invention.

An apparatus 20 includes a Hall effect device 22. Upon exposure of the Hall effect device 22 to a magnetic field, the Hall effect device generates an electrical potential in a known manner. Output circuitry 24 conducts the electrical potential generated by the Hall effect device 22 to suitable circuitry 26. An operating current is supplied to the Hall effect device 22 by input circuitry 28 constructed in accordance with the present invention.

The input circuitry 28 is effective to maintain the electrical potential generated by the Hall effect device 22 constant with variations in the temperature of the Hall effect device. To this end, the input circuitry 28 includes a temperature responsive element 32. The temperature responsive element 32 is maintained at a temperature which varies as a function of variations in the temperature of the Hall effect device 22.

The temperature responsive element 32 varies an electrical characteristic of the input circuitry 28 in response to variations in the temperature of the temperature responsive element and, of course, the Hall effect device 22. The variations in the electrical characteristic of the temperature responsive element 32 are utilized by the input circuitry 28 to vary the operating current conducted to the Hall effect device 22. The input circuitry 28 varies the operating current to the Hall effect device 22 in such a manner as to maintain the electrical potential generated by the Hall effect device constant when the temperature of the Hall effect device varies while the Hall effect device is exposed to a constant strength magnetic field.

In the specific embodiment of the invention illustrated in FIG. 1, the electrical potential generated by the Hall effect device 22 decreases as the temperature of the Hall effect device increases. In order to maintain the electrical potential generated by the Hall effect device 22 constant with variations in the temperature of the Hall effect device, the input circuitry 28 increases the operating current conducted to the Hall effect device in response to increases in the temperature of the Hall effect device. Thus, even though the temperature of the Hall effect device 22 is increased, the output signal from the Hall effect device to the output circuitry 24 is maintained constant while the Hall effect device is exposed to a constant magnetic field by increasing the operating current conducted to the Hall effect device.

Similarly, if the temperature of the Hall effect device 22 is decreased while the Hall effect device is exposed to a constant magnetic field, the electrical potential generated by the Hall effect device tends to increase. In order to maintain the output signal from the Hall effect device 22 constant when the temperature of the Hall effect device is decreased while the Hall effect device is exposed to a constant magnetic field, the input circuitry 28 is effective to decrease the operating current supplied to the Hall effect device.

An electrical characteristic of the temperature responsive element 32 is thermally matched with the thermal characteristics of the Hall effect device 22. Thus, when the temperature of the temperature responsive element 32 is varied, an electrical characteristic of the temperature responsive element varies in a manner which is a function of the manner in which the electrical potential generated by the Hall effect device 22 varies with similar variations in temperature. The Hall effect device 22 and temperature responsive element 32 are maintained at the same temperature.

The temperature responsive element 32 used in one specific preferred embodiment of the invention has an voltage drop which decreases as the temperature of the temperature responsive element increases. Similarly, the voltage drop of the temperature responsive element 32 increases as the temperature of the temperature responsive element decreases. The rate at which the voltage drop across the temperature responsive element 32 varies with variations in temperature is a function of the rate at which the electrical potential generated by the Hall effect device 22 varies with variations in temperature.

Since the Hall effect device 22 and temperature responsive element 32 are maintained at the same temperature, the voltage drop across the temperature responsive element and the electrical potential generated by the Hall effect device will vary together as temperature varies. By responding to variations in the electrical resistance of the temperature responsive element 32, the input circuitry 28 is effective to maintain the electrical potential generated by the Hall effect device constant with variations in temperatures of the Hall effect device. This results in the Hall effect device 22 having a constant output signal to the output circuitry 24 with variations in the temperature of the Hall effect device when the Hall effect device is exposed to a constant magnetic field.

In the specific embodiment of the invention illustrated in FIG. 1, the temperature responsive element 32 is a silicon diode. The silicon diode 32 is connected with an inverting terminal 36 of an operational amplifier 38. A noninverting terminal 40 of the operational amplifier 38 is connected with a constant voltage source.

The output from the operational amplifier 38 supplies the operating current to the Hall effect device 22. The operating current is conducted from the Hall effect device back through the diode 32 to ground.

As the temperature of the silicon diode 32 increases, the voltage drop across the silicon diode decreases. The decrease in the voltage drop across the silicon diode 32 with increasing temperature results in an increase in the output from the operational amplifier 38. The increasing output from the operational amplifier 38 increases the operating current to the Hall effect device 22 as temperature increases.

Increasing the operating current to the Hall effect device 22, for a particular magnetic field, increases the electrical potential generated by the Hall effect device. Therefore, by increasing the operating current conducted to the Hall effect device 22 as the temperature of the Hall effect device increases, the electrical potential generated by the Hall effect device and conducted to the output circuitry 24 remains constant while the magnetic field to which the Hall effect device is exposed remains constant. Of course, the electrical potential generated by the Hall effect device and the output to the control circuitry 24 will vary with variations in the magnetic field to which the Hall effect device is exposed.

Although many different types of Hall effect devices 22 could be utilized, in the specific embodiment of the invention illustrated in FIG. 1, the Hall effect device is a Gallium Arsenide device which is available from F. W. Bell Inc. of Orlando, Fla. under the designation G.H. 800. In this specific embodiment of the invention, the silicon diode 32 is a 1N4148 silicon diode which is commercially available from Sprague of 70 Pembroke Road, Concord, N.H. Of course, different silicon diodes 32 could be utilized with different Hall effect devices 22.

The thermal characteristics of the temperature responsive element or diode 32 and the characteristics of the input circuitry 28 are matched to the thermal characteristics of the Hall effect device 22. Due to this matching, a change in temperature of the silicon diode 32 and Hall effect device 22 results in the operational amplifier 38 changing the operating current conducted to the Hall effect device by an amount sufficient to maintain the electrical potential generated by the Hall effect device constant when the Hall effect device is exposed to a constant magnetic field. This results in the Hall effect voltage transmitted from the Hall effect device 22 to the output circuitry 24 being maintained constant with variations in temperature when the magnetic field to which the Hall effect device is exposed is maintained constant.

In regard to the specific circuitry illustrated in FIG. 1, the Hall effect device 22 has output terminals 42 and 44 which are connected with the output circuitry 24. The output circuitry 24 is connected with terminals 46 and 48 of the circuitry 26. Therefore, upon a variation in the magnetic field to which the Hall effect device 22 is exposed, the Hall voltage conducted over conductors 50 and 52 of the output circuitry 24 to the circuitry 26 is varied.

An operating current for powering the Hall effect device 22 is connected to an input terminal 60 of the Hall effect device 22. The operating current is conducted through the Hall effect device 22 to an output terminal 62. The output terminal 62 of the Hall effect device 22 is connected by conductors 64 and 66 with the temperature responsive silicon diode 32.

The silicon diode 32 is connected to ground potential at 70 through a conductor 72 and resistor 74. The conductor 66 conducts the voltage at the input to the diode 32 to the inverting terminal 36 of the operational amplifier 38. A fixed voltage is conducted from a voltage source 82 through a conductor 84 to the noninverting terminal 40 of the operational amplifier 38. The output current at an output terminal 88 of the operational amplifier 38 varies as a function of variations in the voltage conducted to the inverting terminal 36 of the amplifier relative to the constant voltage conducted to the noninverting terminal 40 of the amplifier.

The output terminal 88 of the operational amplifier is conducted to the input terminal 60 of the Hall effect device 22 by a conductor 90. Of course, the current conducted from the output terminal 88 of the operational amplifier 38 to the input terminal 60 of the Hall effect device 22 is the operating or power current for the Hall effect device.

Since the voltage drop across the silicon diode 32 will vary as a function of variations in the temperature of the silicon diode, the output from the operational amplifier 38 will vary as a function of variations in the temperature of the silicon diode 32. This results in the operating current conducted from the output terminal 88 of the operational amplifier 38 to the input terminal 60 of the Hall effect device 22 increasing as the temperature of the Hall effect device and silicon diode 32 increases. Similarly, as the temperature of the Hall effect device 22 and silicon diode decrease, the operating current conducted from the terminal 88 of the operational amplifier 38 to the input terminal 60 of the Hall effect device is decreased.

In order to maintain the temperature responsive element 32 and Hall effect device 22 at the same temperature, they may be mounted on a common base formed of a thermally conductive material. Thus, in the specific embodiment of the invention illustrated in FIG. 1, the Hall effect device 22 and temperature responsive diode 32 are located adjacent to each other on a common alumina substrate. Of course, the Hall effect device 22 and temperature responsive silicon diode 32 could be mounted on a substrate or base formed of a different material if desired.

It is contemplated that the Hall effect device 22 could be utilized in many different environments. However, it is believed that it may be particularly advantageous to utilize the Hall effect device 22 to detect the magnetic field of an electrical conductor. When the Hall effect device 22 is to be used for this purpose, the Hall effect device may advantageously be mounted in a gap in a core around the electrical conductor. This results in the magnetic field conducted through the core around the electrical conductor being conducted through the Hall effect device 22.

The magnetic field to which the Hall effect device 22 is exposed will vary with variations in the magnetic field conducted through the core around the conductor. Of course, varying the magnetic field to which the Hall effect device 22 is exposed will vary the output voltage between the terminals 42 and 44 of the Hall effect device. Since the operating current conducted through the Hall effect device 22 is varied to eliminate the effect of variations in temperature on the Hall effect device, the output voltage from the Hall effect device varies only as a function of variations in the magnetic field to which the Hall effect device is exposed.

In view of the foregoing description, it is apparent that the present invention provides a new and improved apparatus 20 which includes a Hall effect device 22 which generates an electrical potential upon exposure to a magnetic field. Input circuitry 28 provides an operating current for the Hall effect device 22. In order to maintain the electrical potential generated by the Hall effect device 22 constant with variations in temperature while the magnetic field to which the Hall effect device is exposed remains constant, the input circuitry 28 includes a temperature responsive element 32 which varies an electrical characteristic of the input circuitry in response to a variation in temperature of the temperature responsive element.

Having described the invention, the following is claimed:

1. An apparatus comprising a Hall effect device for generating an electrical potential upon exposure to a magnetic field, output means for conducting from said Hall effect device an output signal which varies as a function of variations in the electrical potential generated by said Hall effect device, and input means for supplying operating current to said Hall effect device through a range of temperatures of said Hall effect device, said input means including means for varying said operating current independently of said output signal to maintain said output signal from said Hall effect device constant with variations in temperature of said Hall effect device through the range of temperatures while the magnetic field to which said Hall effect device is exposed remains constant.

2. An apparatus as set forth in claim 1 wherein said means for varying said operating current includes temperature responsive means which is maintained at a temperature which varies as a function of variations in temperature of said Hall effect device and which varies an electrical characteristic of said input means in response to a variation in temperature of said temperature responsive means.

3. An apparatus as set forth in claim 2 wherein at least a portion of said operating current is conducted through said temperature responsive means, said means for varying said operating current includes means for varying said operating current as a function of variations in a voltage drop across said temperature responsive means.

4. An apparatus as set forth in claim 2 wherein said temperature responsive means is a silicon diode.

5. An apparatus as set forth in claim 1 wherein said means for varying said operating current includes means for sensing changes in the operating current and changing the operating current as a function of the changes in the temperature of the Hall effect device.

6. An apparatus comprising a Hall effect device for generating an electrical potential upon exposure to a magnetic field, output means for conducting from said Hall effect device an output signal which varies as a function of variations in the electrical potential generated by said Hall effect device, and input means for supplying operating current to said Hall effect device through a range of temperatures of said Hall effect device, said input means including means for varying said operating current to maintain said output signal from said Hall effect device constant with variations in temperature of said Hall effect device through the range of temperatures while the magnetic field to which said Hall effect device is exposed remains constant, said means for varying said operating current includes a temperature responsive element which is separate from said Hall effect device and is maintained at a temperature which varies as a function of variations in temperature of said Hall effect device, said temperature responsive element having an electrical characteristic which varies as a function of variations in temperature of said temperature responsive element, said electrical characteristic of said temperature responsive element varies with variations in temperature in a manner which is a function of the manner in which the output signal of said Hall effect device varies with variations in temperature while the magnetic field to which said Hall effect device is exposed remains constant and while the operating current to said Hall effect device remains constant.

7. An apparatus as set forth in claim 6 wherein at least a portion of said operating current is conducted through said temperature responsive element, said electrical characteristic of said temperature responsive element which varies with variations in temperature is a voltage drop across said temperature responsive element.

8. An apparatus as set forth in claim 6 wherein said temperature responsive element is a silicon diode.

9. An apparatus as set forth in claim 6 wherein said means for varying said operating current includes means for sensing changes in the operating current and changing the operating current.

10. An apparatus as set forth in claim 6 wherein said means for varying said operating current is independent of said output signal from said Hall effect device.

* * * * *